(12) United States Patent
Farrell et al.

(10) Patent No.: US 7,478,007 B2
(45) Date of Patent: Jan. 13, 2009

(54) METHOD FOR COMPENSATION OF DEGRADATION IN TUNABLE LASERS

(75) Inventors: Thomas Farrell, Dublin (IE); David McDonald, Dublin (IE); Thomas Mullane, Dublin (IE)

(73) Assignee: Intune Technologies Limited (IE)

( * ) Notice: Subject to any disclaimer, the term of this patent is extended or adjusted under 35 U.S.C. 154(b) by 0 days.

(21) Appl. No.: 10/533,349

(22) PCT Filed: Oct. 30, 2003

(86) PCT No.: PCT/IE03/00148

§ 371 (c)(1),
(2), (4) Date: Jan. 6, 2006

(87) PCT Pub. No.: WO2004/040722

PCT Pub. Date: May 13, 2004

(65) Prior Publication Data

US 2006/0129344 A1    Jun. 15, 2006

(30) Foreign Application Priority Data

Oct. 30, 2002    (IE)    .................................... S020846

(51) Int. Cl.
*G01K 11/30*    (2006.01)
(52) U.S. Cl. ...................................... 702/134
(58) Field of Classification Search ...................... 702/8, 702/40, 49, 57, 60, 64, 65, 75, 79, 80, 107, 702/179, 182–184, 189; 372/20, 29.01; 374/183
See application file for complete search history.

(56) References Cited

U.S. PATENT DOCUMENTS

| 5,450,428 | A | * | 9/1995 | Maeda ......................... 372/20 |
| 5,754,571 | A | * | 5/1998 | Endoh et al. .................. 372/20 |
| 6,252,692 | B1 | * | 6/2001 | Roberts ....................... 398/147 |
| 6,504,856 | B1 | * | 1/2003 | Broberg et al. ........... 372/38.07 |
| 6,590,686 | B1 | * | 7/2003 | Sekiya et al. ................ 398/183 |
| 6,661,974 | B1 | * | 12/2003 | Akiyama et al. .............. 398/95 |
| 6,690,693 | B1 | * | 2/2004 | Crowder .................. 372/29.02 |
| 6,993,459 | B2 | * | 1/2006 | Carrick ........................ 702/189 |
| 2002/0039217 | A1 | * | 4/2002 | Saunders et al. ............ 359/161 |
| 2002/0126724 | A1 | * | 9/2002 | Tsunekane et al. ............ 372/69 |
| 2003/0026302 | A1 | * | 2/2003 | Anthon et al. ........... 372/29.01 |
| 2004/0052299 | A1 | * | 3/2004 | Jay et al. ..................... 374/183 |

* cited by examiner

*Primary Examiner*—Edward Raymond
*Assistant Examiner*—Mohamed Chariou
(74) *Attorney, Agent, or Firm*—McDonnell Boehnen Hulbert & Berghoff LLP

(57) ABSTRACT

The invention provides a method to compensate for degradation in a tunable laser and ensure its performance by tracking the degradation and adjusting the control information accordingly. This is accomplished by performing some measurements of the output of the tunable laser at an initial setup or calibration procedure. Then, by effecting a periodic repetition of these measurements and using a comparison between these two measurements the present invention provides for a compensation factor for the operating conditions, primarily in the form of a look up table of operating points of the laser. These measurements show how much the operating points of the laser have drifted over the period since the last set of measurements, which provide control informatIon to compensate for degradation in the laser.

10 Claims, 3 Drawing Sheets

METHOD FOR COMPENSATION OF DEGRADATION IN TUNABLE LASERS

FIELD OF THE INVENTION

This invention relates to tunable lasers and a method to compensate for the degradation of the tunable lasers. This invention specifically relates to a method to detect changes in the structure of the laser which may lead to changes in the output performance of the laser and a method to compensate the control information to compensate for these effects so that the output of the laser remains constant despite the degradation.

BACKGROUND TO THE INVENTION

Multi section laser diodes are well known in the art and can be switched between different wavelengths. Typically the diode is calibrated at manufacture to determine the correct control currents that should be applied to the laser so as to effect the desired output frequencies from the laser. Degradation in a tunable laser is normally due to dislocations or changes in the material structure of the laser which leads to less injected carriers entering the cavity of the laser and instead passing through the regions surrounding the cavity. These injected carriers that no longer enter the cavity have the effect of reducing the efficiency of the laser as these carriers can no longer contribute to changing the output of the laser.

One of the first known multi-section laser diodes is a three-section tuneable distributed Bragg reflector (DBR) laser. Other types of multi-section diode lasers are the sampled grating DBR (SG-DBR), the superstructure sampled DBR (SSG-DBR) and the grating assisted coupler with rear sampled or superstructure grating reflector (GCSR). A review of such lasers is given in Jens Buus, Markus Christian Amann, "*Tuneable Laser Diodes*" Artect House, 1998 and "*Widely Tuneable Semiconductor Lasers*" ECOC'00. Beck Mason.

FIG. 1 is a schematic drawing of a typical SG-DBR 10. The laser comprises of back and front reflector sections 2 and 8 with an intervening gain or active section 6 and phase section 4. An anti-reflection coating 9 is usually provided on the front and rear facets of the chip to avoid facet modes. The back and the front reflector take the form of sampled Bragg gratings 3 and 5. The pitch of the gratings of the back and front reflector vary slightly to provide a vernier tuning effect through varying the current supplied to these sections. The optical path length of the cavity can also be tuned with the phase section, for example by refractive index changes induced by varying the carrier density in this section. A more detailed description of the SG-DBR and other tuneable multi-section diode lasers can be found elsewhere Jens Buus, Markus Christian Amann, "*Tuneable Laser Diodes*" Artect House, 1998.

As detailed above such tunable semiconductor lasers contain sections where current is injected to control the output frequency, mode purity and power characteristics of the device. Various applications in telecommunications/sensor fields require that the laser can operate at points in a predetermined frequency/wavelength grid; moreover many applications require the power output of the device to be within a defined tolerance for each operating point, and in general, the operating points must be distanced from mode jumps and have high side-mode suppression. In order to provide lasers for such applications, each individual device must be characterised to the desired specification, so there is a corresponding need for a system or algorithm to map the output of the laser over a range of operating currents. For characterisation of lasers in production environments, such a system must also be fast, reliable and automated.

When the calibration is completed a set of operating points are obtained where each operating point corresponds to a required frequency of operating of the laser. The problem exists that as the laser degrades the characteristics of the laser will change relative to this set of operating points and a method to update the table to take these changes into account is required. This invention describes a method where this can be achieved.

OBJECT OF THE INVENTION

The object of the present invention is to provide a method to compensate for degradation in a tunable laser and ensure its performance by tracking the degradation and adjusting the control information accordingly.

SUMMARY OF THE INVENTION

Accordingly the present invention, as set out in the appended claims, provides a method adapted to monitor degradation in tunable lasers and a means to adjust the operating conditions of the laser to compensate for these effects. This is accomplished by performing some measurements of the output of the tunable laser at an initial setup or calibration procedure. Then, by effecting a periodic repetition of these measurements and using a comparison between these two measurements the present invention provides for a compensation factor for the operating conditions, primarily the look up table of operating points of the laser.

These measurements show how much the operating points of the laser have drifted over the period since the last set of measurements. These measurements typically involve one or more of the following steps:

setting the gain section of the laser to a predetermined fixed value;

setting all the tuning sections currents of the laser to zero;

in turn ramp each tuning section from zero to a specified value and measuring the output power/etalon response of the laser during the ramp and setting the tuning section current back to zero.

By having each of the other tuning sections at zero while the measurement is performed, this allows degradation to be measured independently in each section of the laser.

After a specified period of time or when some alarm condition has been reached the measurements specified above are re-measured and compared to the initial measurements. In a first embodiment the location of mode jumps in the laser is the key attribute to examine, but wavelength and/or other parameters can also be considered.

Using the embodiment of examination of the location of the mode jumps it will be appreciated that by examining the differences in the position of the mode jumps a transform function can be calculated to convert the re-measured mode jump positions to the same position as the initial mode jump positions.

This transform function is then used to convert the lookup table of operating points to adjust them for the degradation in the laser.

There is also provided a computer program comprising program instructions for causing a computer program to carry out the above method which may be embodied on a record medium, carrier signal or read-only memory.

BRIEF DESCRIPTION OF THE DRAWINGS

These and other features of the present invention will better understood with reference to the following drawings wherein.

DETAILED DESCRIPTION OF THE DRAWINGS

The invention will now be described with reference to exemplary embodiments thereof and it will be appreciated that it is not intended to limit the application or methodology to any specific example, but rather can be applied to any tunable laser. The techniques used by the method of the present invention are specifically provided to enable the measurement of degradation and a means to compensate for this effect.

Figure 1:
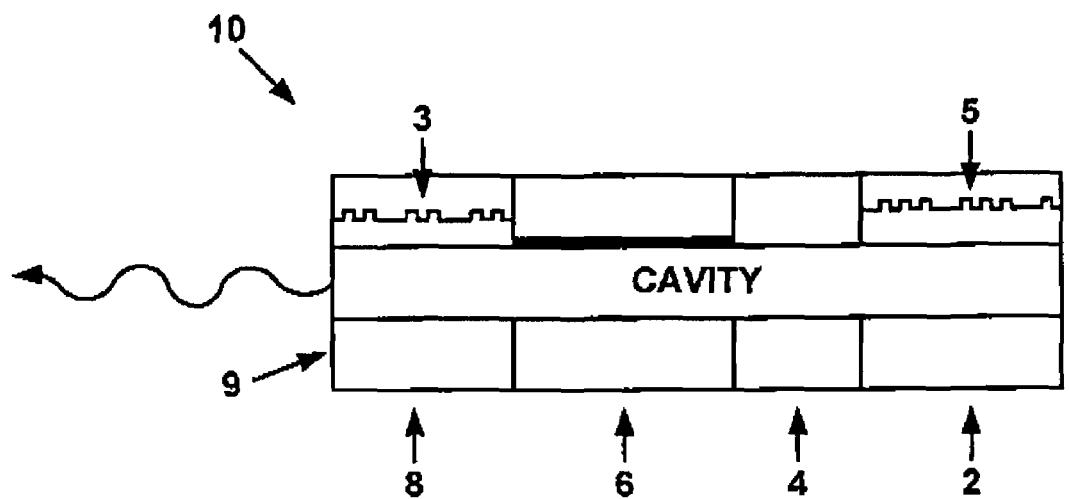
FIG. 1 shows a schematic of a Sampled Grating Distributed Bragg Reflector Laser diode (SG-DBR).
Figure 2:
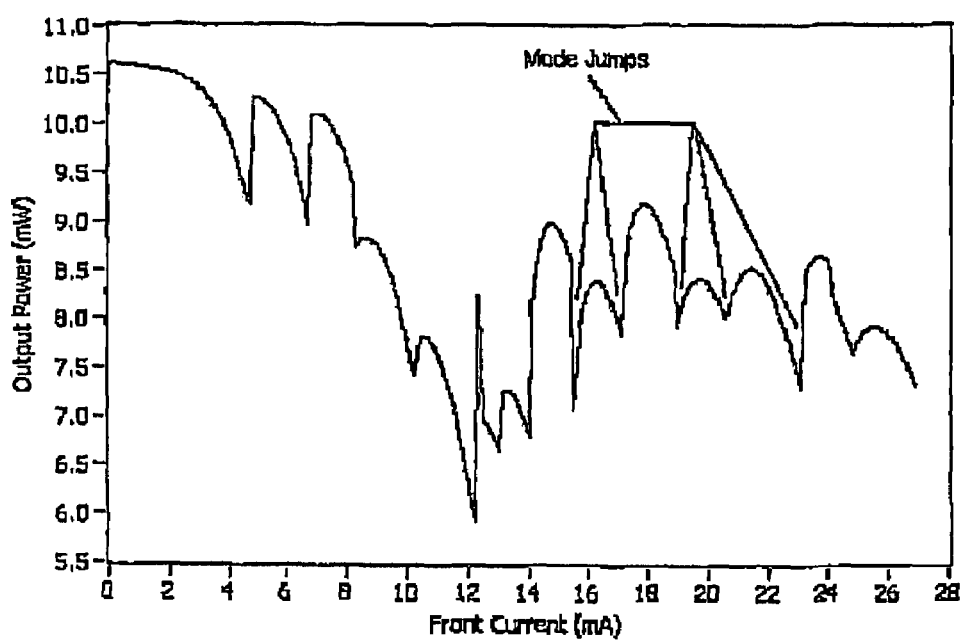
FIG. 2 shows a graph of an initial set of measurements from the laser showing the results from the front tuning section of an SG-DBR laser.

Initially a set of measurements are performed on the laser that show the positions of mode jumps in the laser for each section of the laser where the other tuning section currents are set to zero. An example of such a measurement output is shown in FIG. 2.

These measurements are performed by:
(a) setting the gain current of the laser to a specified predetermined value. This value may, for example, be the average gain current of the operating points in the lookup table.
(b) setting the tuning currents of the laser to zero.
(c) measuring the output power/etalon/wavelength of the laser while the current of one tuning section is increased and while the currents in all other tuning sections is set to zero, and
(d) repeating the above measurement for all tuning sections of the laser.

The above measurement provides a first or reference measurement at time zero when no degradation has occurred in the laser. This measurement is shown in FIG. 2.

Figure 3:
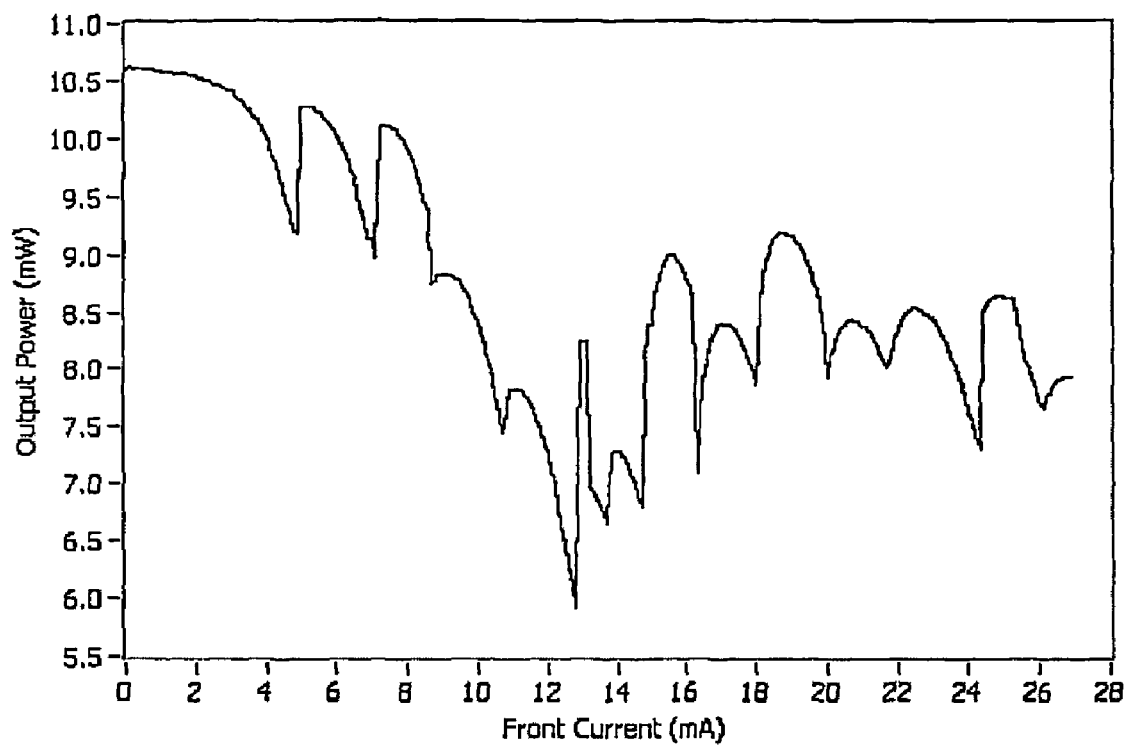
FIG. 3 shows a graph of a set of measurements from the laser after degradation has occurred showing the results from the front tuning section of an SG-DBR laser.

When degradation has occurred in the laser after a specified time of operating, or when some alarm condition has been triggered the above measurement may be repeated. An example of such a measurement set as determined at a later period is shown in FIG. 3.

Figure 4:
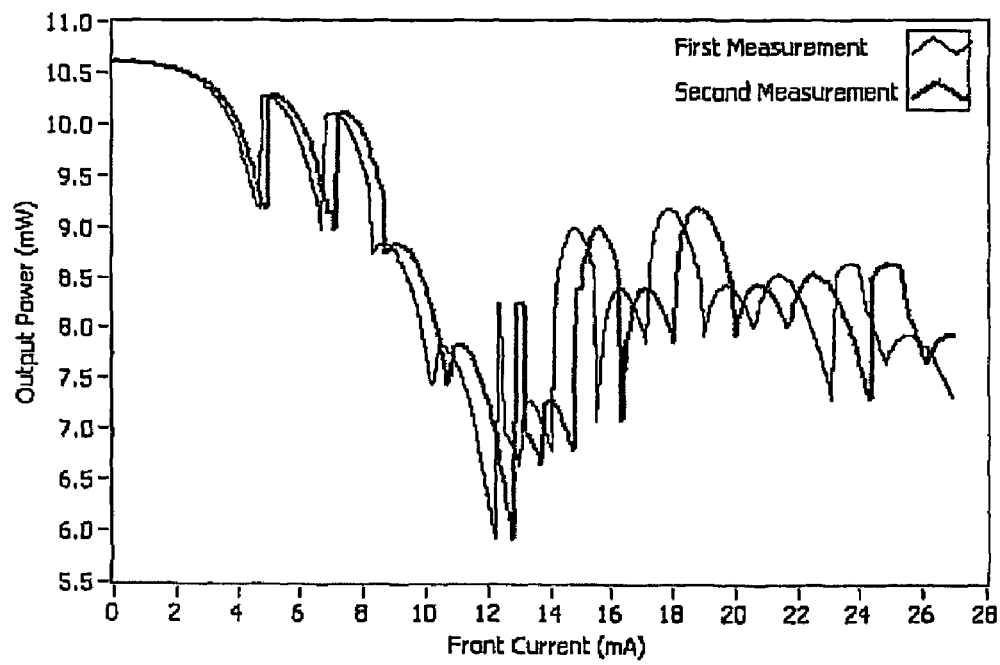
FIG. 4 shows the measurement in FIG. 3 overlaid on FIG. 2.

By a comparison of the reference measurement and the degraded measurement of each tuning section in turn the positions of the mode jumps of the laser will be located at different currents. This can be seen in FIG. 4. It will be noted that the figures shown show output power of the laser and where there is a jump or discontinuity in the output power of the laser this denotes a mode jump.

Figure 5:
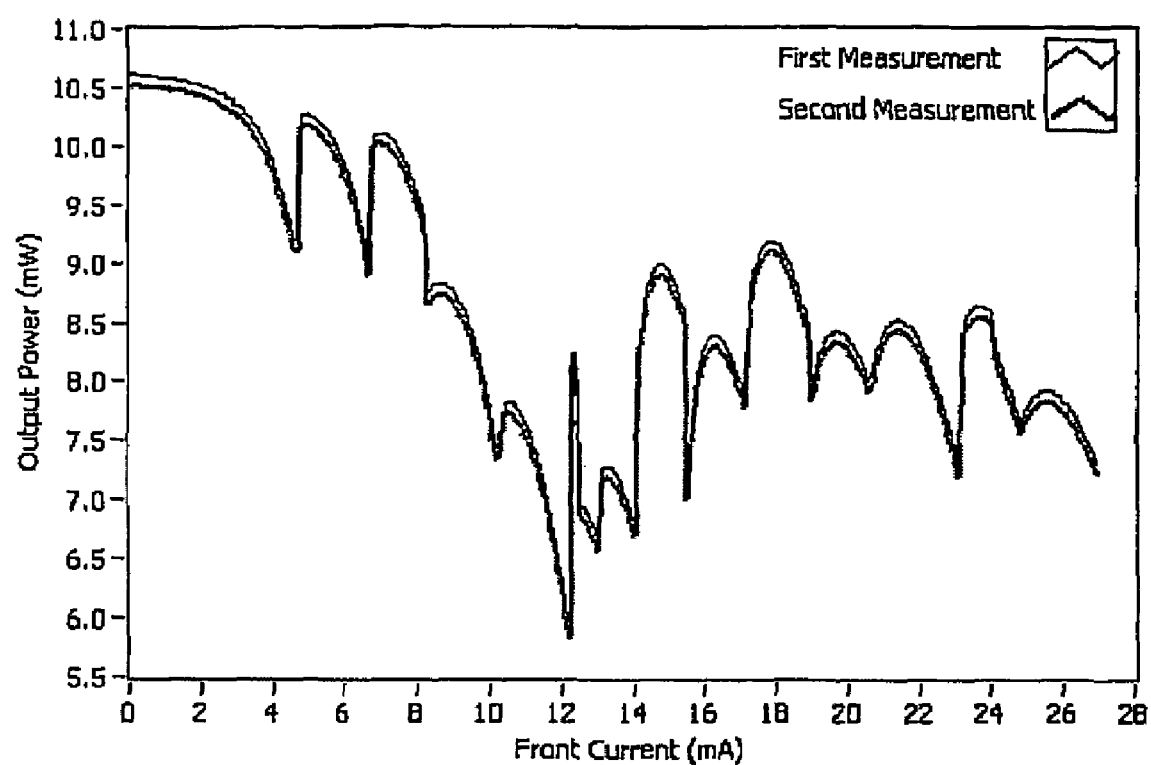
FIG. 5 shows the measurement in FIG. 3 overlaid on FIG. 2 where the data in FIG. 3 has been converted by a transform function so that the position of mode jumps overlaps.

By applying a transform on the degraded measurement the locations of mode jumps can be overlaid on the initial measurement. This is shown in the example of FIG. 5 where the transform takes the following form:

$P_i(I_t)$ is the initial power measurement as a function of the tuning current $P_d(I_t)$ is the degraded power measurement as a function of the tuning current The mode jumps in each measurement can then be located by differentiation or some other techniques as will be apparent to those skilled in the art. This means that we find a set of currents ($I_t$) for both measurements where mode jumps occur $(I_{f0}, I_{f1}, I_{f2}, I_{f3} \ldots I_{fn})$
$(I_{s0}, I_{s1}, I_{s2}, I_{s3} \ldots I_{sm})$ The transform (T) is such that $(I_{f0}, I_{f1}, I_{f2}, I_{f3} \ldots I_{fn}) = T((I_{s0}, I_{s1}, I_{s2}, I_{s3} \ldots I_{sm}))$ In the example shown in FIG. 5 the transform is $T(I_t) = a + bI_t$ And where a and b are constants defining the amount of degradation that has occurred. As shown in FIG. 5 the values of a and b are a=0
b=0.95

This corresponds to this tuning section requiring 5% more current to achieve the same mode jump in the laser and is equivalent to a leakage current increasing in this laser section.

Though the example above shows a linear relationship in the transform T, other forms of this equation can be used such as super-linear, n-dimension polynomial, exponential or otherwise.

One important distinction to mention with this invention is that as the other tuning sections have zero current there will be no difference in the output of the laser due to degradation in these sections and each section can be taken independently and its degradation measured.

This can be explained by the following: The aging rate for lasers in general follow the Arrhenius relationship according to the following equation:

$$A.R \propto J^n \exp\left(\frac{e_a}{kT_j}\right)$$

where A.R is the aging rate
$e_a$ is the activation energy
J is the current density in the material
k is Boltzmann constant
$T_j$ is the junction temperature
n is the stress rate exponent and where the laser is subjected to stress levels J and Tj and where n is the stress rate exponent for the current density. Each section can be described by this equation independently and each section will also have different values defining its aging rate. In the current invention the aging rate is zero for J=0 implying that the aging of the device under operation (after time T) can be compared to the device characteristics at time 0, provided that $J_t=0$ for all t, where $J_t$ is the current density for all tuning section of the laser. Therefore the aging of one section can be measured independently by setting J (the current density, which is proportional to the current) to zero.

When the transform have been obtained for all tuning sections the lookup table of operating points can be transformed using the inverse of the transform on each respective tuning section of the laser. Thereafter the new lookup table has been compensated for degradation in the laser.

In a similar embodiment of the above invention a comparator can be used to obtain the mode jumps of a laser. This is achieved by setting the comparator to transition between high and low when the output power or wavelength or etalon response moves above or below a specific value. By setting this value to the median between two levels where there is a jump in the response corresponding to a mode jump in laser this can be detected with the comparator. The advantage of this is that it is fast and doesn't require many analogue to digital conversions.

In another embodiment of the invention degradation can be measured while performing switches between two operating points from the set of operating points. These operating points may be selected as the two operating points with the largest current difference between them in all currents as this will cause the most severe thermal effect in the laser.

Then for one of the operating points, normally the one with the highest currents, a set of operating points is obtained in the tuning space about this point. Typically this may be a set current that is added and subtracted to each of the tuning currents in turn. E.g. for an SG-DBR laser this would mean obtaining 6 operating points, two for each of the three tuning sections.

The transitions from the first operating point to each of the points about the second operating point are then tested. If any of the transitions fail to achieve the same wavelength as the second operating point that transition is adjudged to have failed.

By observing which operating points have failed we obtain a vector for adjustment of the second operating point. By adjusting all the operating points in the table using this vector the degradation in the device can be compensated out of the performance of the laser.

Other embodiments of this invention include methods to blank the output of the device while the above measurements are being performed. In one embodiment the laser may have a SOA (Semiconductor Optical Amplifier) but coupled to the output of the laser. This section can be negatively biased or otherwise to make it lossly and hence reduce the output light from the laser. Other sections such as EA (electro absorption) modulators can also perform a similar effect. Also in another embodiment the phase section or other tuning sections can be used as a photo-detector to monitor the mode positions or output characteristics of the laser while the other section currents are varied. This means that if the output of the laser is disabled through use of an SOA or otherwise the measurements can be performed therefore the output of the laser will not interfere with the system it may be connected to.

It will be appreciated that the present invention provides an efficient manner to effectively compensate for degradation in performance of a laser diode. Although it has been described with reference to an exemplary embodiment, it will be appreciated that it is not intended to limit the present specification in any manner except as may be necessary in the light of the appended claims.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

The words "comprises/comprising" and the words "having/including" when used herein with reference to the present invention are used to specify the presence of stated features, integers, steps or components but does not preclude the presence or addition of one or more other features, integers, steps, components or groups thereof.

The invention is not limited to the embodiments hereinbefore described but may be varied in both construction and detail.

The invention claimed is:

1. A method of measuring the degradation in a tunable laser comprising the steps of:
   a. performing a first set of initial measurements on the laser to provide a reference set of measurements corresponding to a performance of the laser when no degradation has occurred, wherein performing the first set of initial measurements comprises:
      i. setting a gain current of the laser to a specified predetermined value;
      ii. setting tuning currents of the laser to zero;
      iii. measuring an output power, etalon, or wavelength of the laser while a current of one tuning section is increased and while currents in all other tuning sections are set to zero; and
      iv. repeating steps (i)-(iii) for all tuning sections of the laser;
   b. performing a second set of measurements on the laser where some degradation has occurred; and
   c. effecting a comparison of the first and second set of measurements so as to provide a measure of the degradation in the laser to compensate for the performance of the laser.

2. The method of claim 1, wherein positions of mode jumps in the two sets of measurements are compared and a transform is obtained and wherein mode jumps from the second set of measurements are transformed to the same currents as corresponding mode jumps determined from the first measurement.

3. The method of claim 2, further comprising the step of converting operating points of the tunable laser by said transform to obtain a new set of operating points, wherein the new set of operating points compensates for degradation in the laser.

4. The method of claim 1, wherein the specified predetermined value of the gain current selected is an average gain current of operating points in a lookup table corresponding to the laser.

5. The method of claim 1, wherein performing the second set of measurements comprises:
   d. setting a gain current of the laser to a specified predetermined value;
   e. setting tuning currents of the laser to zero;
   f. measuring an output power, etalon, or wavelength of the laser while a current of one tuning section is increased and while currents in all other tuning sections are set to zero; and
   g. repeating steps (d)-(f) for all tuning sections of the laser.

6. The method of claim 1, wherein said comparison of the first set of measurements with the second set of measurements is carried out by comparing wavelength or etalon responses of the degradation of the device that are measured.

7. The method of claim 1, wherein performing the second set of measurements comprises:
   locating a subset of mode jumps from the first measurement set; and
   re-measuring a region around each of the mode jumps in the same manner as the first set of measurements.

8. A computer readable medium having stored therein instructions for causing a processor to:

a. perform a first set of initial measurements on the laser to provide a reference set of measurements corresponding to a performance of the laser when no degradation has occurred, wherein performing the first set of initial measurements comprises:
   i. setting a gain current of the laser to a specified predetermined value;
   ii. setting tuning currents of the laser to zero;
   iii. measure an output power, etalon, or wavelength of the laser while a current of one tuning section is increased and while currents in all other tuning sections are set to zero; and
   iv. repeat steps (i)-(iii) for all tuning sections of the laser;
b. perform a second set of measurements on the laser where some degradation has occurred; and
c. effect a comparison of the first and second set of measurements so as to provide a measure of the degradation in the laser to compensate for the performance of the laser.

9. The computer readable medium of claim 8, wherein the computer readable medium is a read only memory.

10. A method of measuring degradation in a tunable laser comprising the steps of:

a. performing a first set of initial measurements on the laser to provide a reference set of measurements corresponding to a performance of the laser when no degradation has occurred;
b. performing a second set of measurements on the laser where some degradation has occurred wherein performing the second set of measurements comprises:
   i. setting a gain current of the laser to a specified predetermined value;
   ii. setting tuning currents of the laser to zero;
   iii. measuring an output power, etalon, or wavelength of the laser while a current of one tuning section is increased and while currents in all other tuning sections are set to zero; and
   iv. repeating steps (i)-(iii) for all tuning sections of the laser; and
c. effecting a comparison of the first and second set of measurements so as to provide a measure of the degradation in the laser to compensate for the performance of the laser.

\* \* \* \* \*